United States Patent
Wang

(10) Patent No.: US 10,330,996 B2
(45) Date of Patent: Jun. 25, 2019

(54) COMMON STRUCTURE OF HIGH VERTICAL ALIGNMENT PADS

(71) Applicant: SHENZHEN CHINA STAR OPTOELECTRONICS SEMICONDUCTOR DISPLAY TECHNOLOGY CO., LTD, Shenzhen, Guangdong (CN)

(72) Inventor: Tianhong Wang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/744,741

(22) PCT Filed: Dec. 14, 2017

(86) PCT No.: PCT/CN2017/116276
§ 371 (c)(1),
(2) Date: Jan. 12, 2018

(65) Prior Publication Data
US 2019/0137807 A1 May 9, 2019

(30) Foreign Application Priority Data
Nov. 7, 2017 (CN) .......................... 2017 1 1086727

(51) Int. Cl.
*G02F 1/1345* (2006.01)
*G02F 1/136* (2006.01)
(Continued)

(52) U.S. Cl.
CPC .......... *G02F 1/13458* (2013.01); *G02F 1/136* (2013.01); *G09G 3/006* (2013.01); *H01L 27/124* (2013.01); *G02F 2001/136254* (2013.01)

(58) Field of Classification Search
CPC ..... G02F 1/13458; G02F 2001/136254; H01L 27/124
See application file for complete search history.

(56) References Cited

U.S. PATENT DOCUMENTS 6,873,392 B2 * 3/2005 Lim .................... G02F 1/13458
349/147
9,508,274 B2 11/2016 Ro et al.

FOREIGN PATENT DOCUMENTS

CN 101598875 A 12/2009
CN 104464580 A 3/2015
(Continued)

*Primary Examiner* — Quoc D Hoang
(74) *Attorney, Agent, or Firm* — Hauptman Ham, LLP

(57) ABSTRACT

A common structure of HVA pads comprises a set of HVA pads for common use. The set of HVA pads includes n clock pads, m DC high potential pads for inputting DC high potentials, a DC low potential pad for inputting a DC low potential, and n clock transferring circuits corresponding to the n clock pads separately. m is a natural number larger than one illustrating the number of chips using in common the set of HVA pads, n is a natural number. The n clock pads are connected separately to the corresponding n clock transferring circuits for inputting corresponding clock signals to the n clock transferring circuits individually. The m DC high potential pads and the DC low potential pad are connected to each the clock transferring circuit for inputting m DC high potentials and a DC low potential to each the clock transferring circuit.

15 Claims, 4 Drawing Sheets

(51) Int. Cl.
*H01L 27/12* (2006.01)
*G09G 3/00* (2006.01)
*G02F 1/1362* (2006.01)

(56) References Cited

FOREIGN PATENT DOCUMENTS

| CN | 105810136 A | 7/2016 |
|---|---|---|
| CN | 206863434 U | 1/2018 |

* cited by examiner

COMMON STRUCTURE OF HIGH VERTICAL ALIGNMENT PADS

RELATED APPLICATIONS

The present application is a National Phase of International Application Number PCT/CN2017/116276, filed on Dec. 14, 2017, and claims the priority of China Application 201711086727.6, filed on Nov. 7, 2017.

FIELD OF THE DISCLOSURE

The disclosure relates to the technical field of liquid crystals displays, and more particularly to a common structure of high vertical alignment (HVA) pads.

BACKGROUND

The flat panel display, such as liquid crystals display (LCD), with advantages of high quality, power saving, thin body and wide application field, has been widely used in many consuming electronic product, such as mobile phone, TV, personal digital assistant (PDA), digital camera, notebook, laptop, etc., and dominates the display field.

The active liquid crystals display comprises a plurality of pixels, and each pixel includes a thin film transistor (TFT). The gate of the TFT is connected to the horizontal scan line. The source of the TFT is connected to the vertical data line. The drain of the TFT is connected to the pixel electrode. A sufficient voltage is applied to the scan line to switch on all the TFTs connected to the scan line. At this time, the pixel electrodes on the horizontal scan line are connected to the vertical data lines, thereby to write the display signals on the data line into the pixel electrodes and to control the transmittances of different liquid crystals for achieving the effect of controlling colors and brightness. The driving of horizontal scan lines of the current active liquid crystals displays is fulfilled by external connected IC chips mainly. The external IC chips can control each stage of scan lines to charge and discharge stage by stage. The gate driver on array (GOA) technology utilizes the current process of fabricating array on the thin film transistor liquid crystals display panel to manufacture the driving circuit of gate lines on the array substrate, for realizing the driving method of scanning the gate lines row by row.

The current mainstream TFT-LCD display market includes three types, a twisted nematic (TN) or super twisted nematic (STN) type, an in-plane switching (IPS) type, and a vertical alignment (VA) type, wherein the VA type LCD shows a higher contrast compared to the other types, and is widely applied to large-size display, such as TV. The High Vertical Alignment (HVA) mode is one important branch in the VA modes. When the HVA liquid crystals display panel functions, the twist of the liquid crystals molecules in the liquid crystals layer is controlled by the vertical electric field formed between the pixel electrode of the array substrate and the common electrode of the color filter substrate. LC photo-alignment technology refers to exposing a LCD panel to ultraviolet when a voltage is being applied to the LCD panel, to cause the monomer of the LCD to react and allow a liquid crystals molecule to form a pre-tilt angle.

In the manufacturing process of LCD, it is necessary to test the products in some specific stages for finding problems, thereby to repair the products and promote the product yield. If it is required to test products, the GOA circuits and the active areas (AA) should be powered on. Therefore, it is necessary to dispose signal pads around peripheral wires for providing power via pins. In current GOA products, there are increasing demands such as high resolution, larger size and high frequency. For achieving these demands, it is necessary to provide extra signals for sharing the RC loading in product design, to make the main board have enough power for keeping signals stable. For example, in the GOA products, four clock signals required for high definition are added to be twelve clock signals required for the trigate of ultra-definition. Therefore, it is required for each set of pins of the testing device to add eight pins for performing tests. A photomask includes the patterns of multiple chips, so it is required to perform the test for multiple chips or the alignment process to liquid crystals simultaneously while considering production capacity. That is, the number of pads in current design needs to be added. Therefore, it is necessary to add 8×N pins in the testing device, wherein N is the number of chips on a substrate, and the cost would be increasing too much. In the meantime, too many pins also cause the tense space issue in design typography.

As shown in FIG. 1A, the design scheme of current normal HAV pads is illustrated. Multiple sets of high vertical alignment (HVA) pads 1 and others such as array test pads 2 and cell test pads 3 are disposed around peripheral wires of chips 4.

As shown in FIG. 1B, the specific types of pads included in the current HAV pads are illustrated. Each set of HAV pads 1 is applied to perform the test or alignment process to liquid crystals molecules. According to the specific GOA circuit structures on chips 4, a set of HAV pads 1 includes n clock pads CK1 . . . CKn for inputting clock signals, a color filter substrate common voltage pad CFcom for inputting a color filter substrate common voltage, an array substrate common voltage pad Acom for inputting an array substrate common voltage, a DC high voltage pad VGH for inputting a DC high voltage, etc., and each pad is connected to the corresponding position of the peripheral wires according to the type thereof. The specific types and numbers of pads of each set of HAV pads can be determined according to demands of tests or alignment processes of liquid crystals for chips 4.

According to the current normal design of HAV pads, each chip 4 is corresponding to one set of HAV pads 1. If one set of HAV pads 1 includes M pads, for n chips 4, it needs N×M pads in the normal condition, thereby to have the number of pads in one set of HAV pads 1 increase too much, which would cause the tense space issue in design typography and increasing cost. If one set of HAV pads 1 is applied to perform tests or alignment process to liquid crystals, and in case the wiring in one chip 4 is short road, it is possible to cause the tests for other chips 4 and the alignment to liquid crystals are failed.

SUMMARY

Accordingly, one purpose of the present invention is to provide a common structure of HVA pads for using one set of high vertical alignment (HVA) pads to provide signals simultaneously for multiple chips.

For achieving the above purpose, the present invention provides a common structure of HVA pads comprising: a set of HVA pads for common use, wherein the set of HVA pads includes n clock pads, m DC high potential pads for inputting DC high potentials, a DC low potential pad for inputting a DC low potential, and n clock transferring circuits corresponding to the n clock pads separately; wherein m is a natural number larger than one illustrating a number of chips using in common the set of HVA pads, n is a natural number;

and the n clock pads are connected separately to the corresponding n clock transferring circuits for inputting corresponding clock signals to the n clock transferring circuits individually, the m DC high potential pads and the DC low potential pad are connected to each the clock transferring circuit for inputting m DC high potentials and a DC low potential to each the clock transferring circuit; and when each the clock transferring circuit is input the corresponding clock signal, the m DC high potentials and the DC low potential, the corresponding clock signal is controlling each the clock transferring circuit to output m clock signals to the m chips according to the m DC high potentials and the DC low potential.

The m DC high potential pads are inputting a same DC high potential.

The m DC high potentials are square wave; and the DC high potential is a high level of the square wave.

In an embodiment, the m DC high potentials are square wave, and the DC low potential is a low level of the square wave.

In an embodiment, each the clock transferring circuit comprises m units, the m units are corresponding to the m DC high potential pads and the m chips separately, for outputting the corresponding clock signal to the corresponding chip, each the unit comprises a first thin film transistor and a second thin film transistor.

The first thin film transistor including a gate connected to the clock pad corresponding to the current clock transferring circuit, a source connected to the DC high potential pad corresponding to the current unit, and a drain connected to the chip corresponding to the current unit.

The second thin film transistor including a gate being input a signal opposite in phase to a signal inputting to the gate of the first thin film transistor, a source connected to the chip corresponding to the current unit, and a drain connected to the DC low potential pad.

In an embodiment, the corresponding clock signals input to the n clock transferring circuits through the clock pads are square wave, and the DC high potential is equal to a high level of the square wave.

In an embodiment, the DC low potential is equal to a low level of the square wave.

In an embodiment, the common structure of HVA pads is connected to GOA circuits and peripheral wires of an active area of an active LCD.

In an embodiment, the set of HVA pads further comprises a color filter substrate common voltage pad for inputting a color filter substrate common voltage.

In an embodiment, the set of HVA pads further comprises an array substrate common voltage pad for inputting an array substrate common voltage.

The present invention also provides a common structure of HVA pads, comprising: a set of HVA pads for common use, wherein the set of HVA pads includes n clock pads, m DC high potential pads for inputting DC high potentials, a DC low potential pad for inputting a DC low potential, and n clock transferring circuits corresponding to the n clock pads separately; wherein m is a natural number larger than one illustrating a number of chips using in common the set of HVA pads, n is a natural number, and the n clock pads are connected separately to the corresponding n clock transferring circuits for inputting corresponding clock signals to the n clock transferring circuits individually, the m DC high potential pads and the DC low potential pad are connected to each the clock transferring circuit for inputting m DC high potentials and a DC low potential to each the clock transferring circuit; and when each the clock transferring circuit is input the corresponding clock signal, the m DC high potentials and the DC low potential, the corresponding clock signal is controlling each the clock transferring circuit to output m clock signals to the m chips according to the m DC high potentials and the DC low potential.

In an embodiment, the m DC high potential pads are inputting a same DC high potential.

In an embodiment, each the clock transferring circuit comprises m units, the m units are corresponding to the m DC high potential pads and the m chips separately; for outputting the corresponding clock signal to the corresponding chip; each the unit comprises: a first thin film transistor including a gate connected to the clock pad corresponding to the current clock transferring circuit, a source connected to the DC high potential pad corresponding to the current unit, and a drain connected to the chip corresponding to the current unit; and a second thin film transistor including a gate being input a signal opposite in phase to a signal inputting to the gate of the first thin film transistor, a source connected to the chip corresponding to the current unit; and a drain connected to the DC low potential pad.

In an embodiment, the common structure of HVA pads is connected to GOA circuits and peripheral wires of an active area of an active LCD.

In an embodiment, the set of HVA pads further comprises a color filter substrate common voltage pad for inputting a color filter substrate common voltage.

In an embodiment, the set of HVA pads further comprises an array substrate common voltage pad for inputting an array substrate common voltage.

In conclusion, the common structure of HVA pads of the present invention uses one set of HAV pads to provide signals simultaneously for multiple chips, to perform tests or alignment processes of liquid crystals molecules, thereby to reduce process time and decrease costs, for easing the tense space issue in design typography and promoting the utilization rate of the glass substrates.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

Figure 1A:
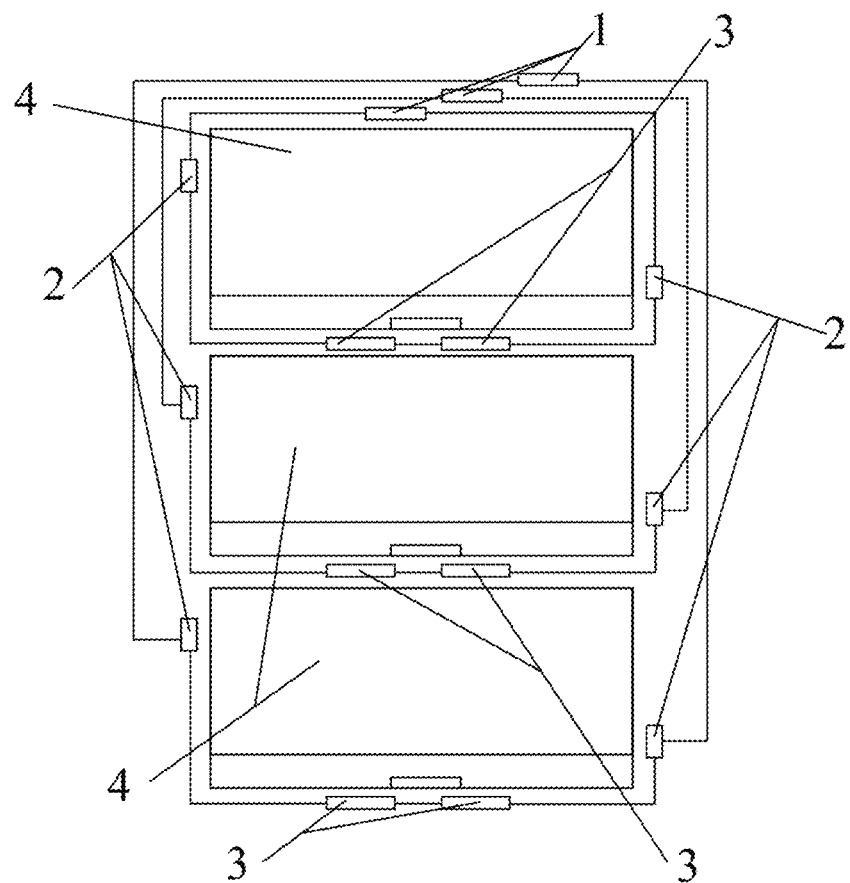
FIG. 1A is the design view of current normal HAV pads.
Figure 1B:
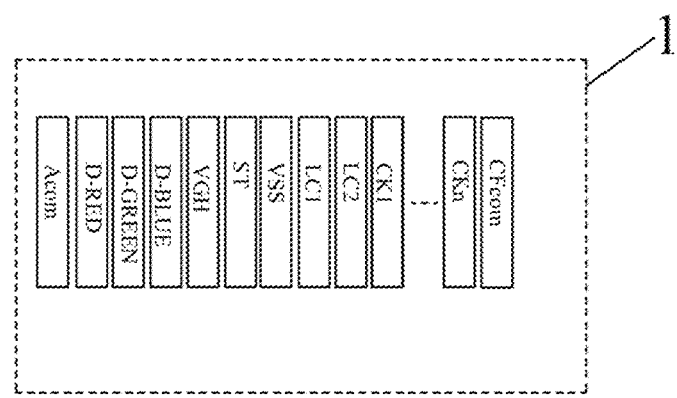
FIG. 1B is a scheme view illustrating the specific types of pads included in the current HAV pads of FIG. 1A.
Figure 2:
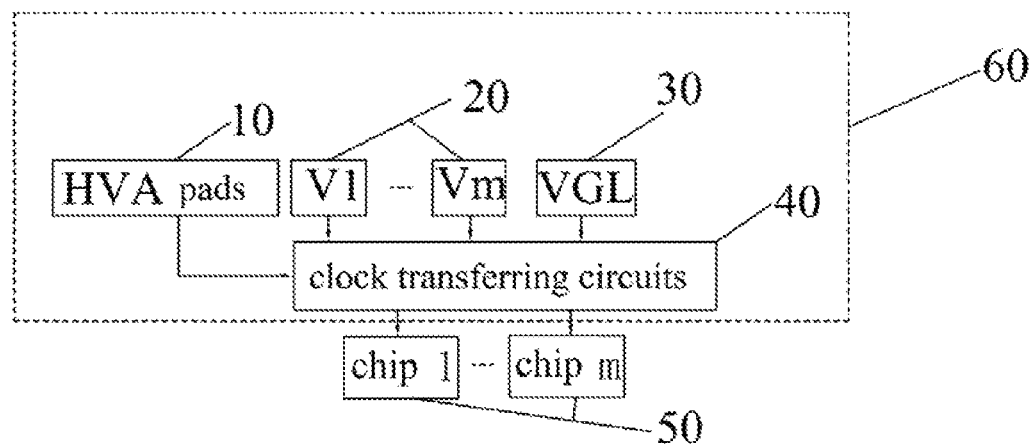
FIG. 2 is a structure view illustrating a common structure of HVA pads in a preferred embodiment of the present invention.

Referring to FIG. 2, the structure scheme of a common structure of high vertical alignment (HVA) pads in a preferred embodiment of the present invention is illustrated. The common structure of HVA pads 60 of present invention comprises the following elements. A set of HVA pads 10 for common use. The set of HVA pads 10 includes n clock pads, m DC high potential pads 20 for inputting DC high potentials V1 to Vm, a DC low potential pad 30 for inputting a DC low potential VGL, and n clock transferring circuits 40 corresponding to the n clock pads separately, wherein m is a natural number larger than one illustrating the number of chips using in common the set of HVA pads, and n is a natural number. The n clock pads are connected separately to the corresponding n clock transferring circuits 40 for inputting corresponding clock signals to the n clock transferring circuits 40 individually. The m DC high potential pads 20 and the DC low potential pad 30 are connected to each the clock transferring circuit 40 for inputting m DC high potentials and a DC low potential to each the clock transferring circuit 40. When each the clock transferring circuit 40 is input the corresponding clock signal, the m DC high potentials and the DC low potential, the corresponding clock signal is controlling each the clock transferring circuit 40 to output m clock signals to the m chips 50 according to the m DC high potentials and the DC low potential.

In the present invention, the original required one set of HVA pads 10 is just added with m+1 pads, m is corresponding to the number of chip patterns included on a photomask. The clock transferring circuits are designed in the areas of the clock pads of the HVA pads 10. The present invention can be applied to the GOA products in active LCDs, and the common structure can be applied to connect with the GOA circuits of the active LCDs and the peripheral wires of the active areas.

Figure 3:
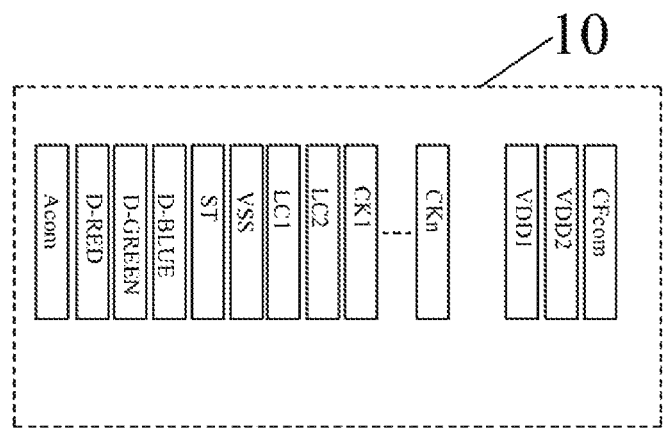
FIG. 3 is a scheme view illustrating the specific types of pads included in the HAV pads of FIG. 2.

Referring to FIG. 3, the specific types of pads included in the HAV pads shown in FIG. 2 are illustrated as an example for explaining the present invention. Each set of HVA pads 10 is applied to perform the tests for chips 50 or the alignment process to liquid crystals in the manufacturing process. According to the specific GOA circuit structures on the chips 50, one set of HVA pads 10 includes n clock pads CK1 to CKn for inputting clock signals, a color filter substrate common voltage pad CFcom for inputting a color filter substrate common voltage, an array substrate common voltage pad Acorn for inputting an array substrate common voltage, low frequency clock pads LC1 and LC2 for inputting low frequency clock signals, etc., and each the pad is connected to the corresponding position of the peripheral wires according to the type thereof. The specific types and numbers of pads included in each set of HAV pads 10 can be determined according to demands of the tests or the alignment process to liquid crystal. When the tests or the alignment process to liquid crystals are performed in the manufacturing process, testing device would be connected to the pads via the pins for providing the corresponding signals or voltages.

Figure 4:
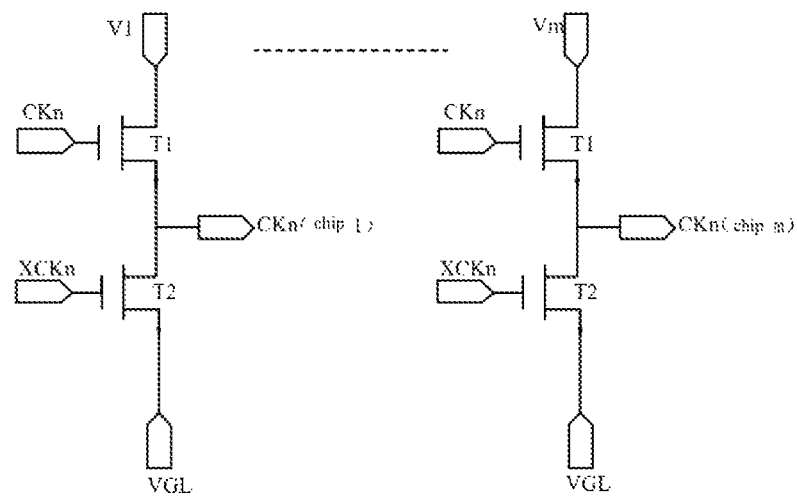
FIG. 4 is a circuit scheme illustrating the clock transferring circuits of the common structure of HVA pads in a preferred embodiment of the present invention.

FIG. 4 is a circuit scheme view of the clock transferring circuits of the common structure of HVA pads in a preferred embodiment of the present invention. Each the clock transferring circuit 40 comprises m units. The m units are corresponding to the m DC high potential pads 20 and the m chips 50 separately, for outputting the corresponding clock signal to the corresponding chip 50. Each the unit comprises a first thin film transistor T1 and a second thin film transistor T2.

The first thin film transistor T1 includes a gate connected to the clock pad CKn corresponding to the current clock transferring circuit for inputting the corresponding clock signal CKn, a source connected to the DC high potential pad, namely one of V1 to Urn, corresponding to the current unit, and a drain connected to the chip, namely one of the chip 1 to the chip m, corresponding to the current unit.

The second thin film transistor T2 includes a gate being input a signal XCKn opposite in phase to the signal CKn inputting to the gate of the first thin film transistor T1, a source connected to the chip, namely one of the chip 1 to the chip m, corresponding to the current unit, and a drain connected to the DC low potential pad VGL.

In the design of the common structure of HVA pads of the present invention, the clock transferring circuits 40 included therein can divide a clock signal to multiple branched signals, and these multiple branched signals are not interfering with each other. For example; the number of clock signals on a GOA product is A; the design of the present invention can save (A−1)×m(m+1) pads. (A−1)×m is the number of clock pads to be saved due to common use, (m+1) is the number of the signals V1 to Vm plus the signal VGL. The signals V1 to Vm could be all the VGH signal for inputting the same DC high potential. The m clock signals outputting to chips 50 via the clock transferring circuits 40 could be square wave. The DC high potential VGH is the high level of the square wave, and the DC low potential VGL is the low level of the square wave.

Figure 5:
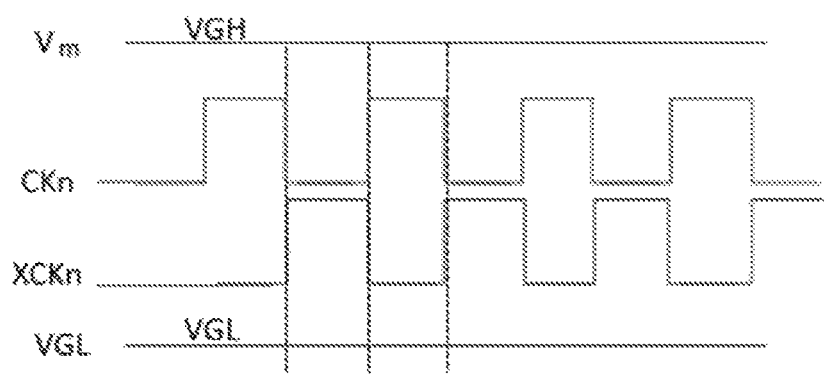
FIG. 5 is a timing diagram of the common structure of HVA pads in one preferred embodiment of the present invention.

FIG. 5 is a timing diagram of the common structure of HVA pads in one preferred embodiment of the present invention. The clock signals CKn and XCKn are opposite in phase to each other and both are square wave. Taking the clock pads CKn as an example, the corresponding clock signals CKn individually inputting the corresponding n clock transferring circuits via the clock pads are square wave. The DC high potential VGH is equal to the high level of the square wave, and the DC low potential VGL is equal to the low level of the square wave. Namely the clock signals CKn transferred through the clock transferring circuits 40 have the same waveform.

Figure 6:
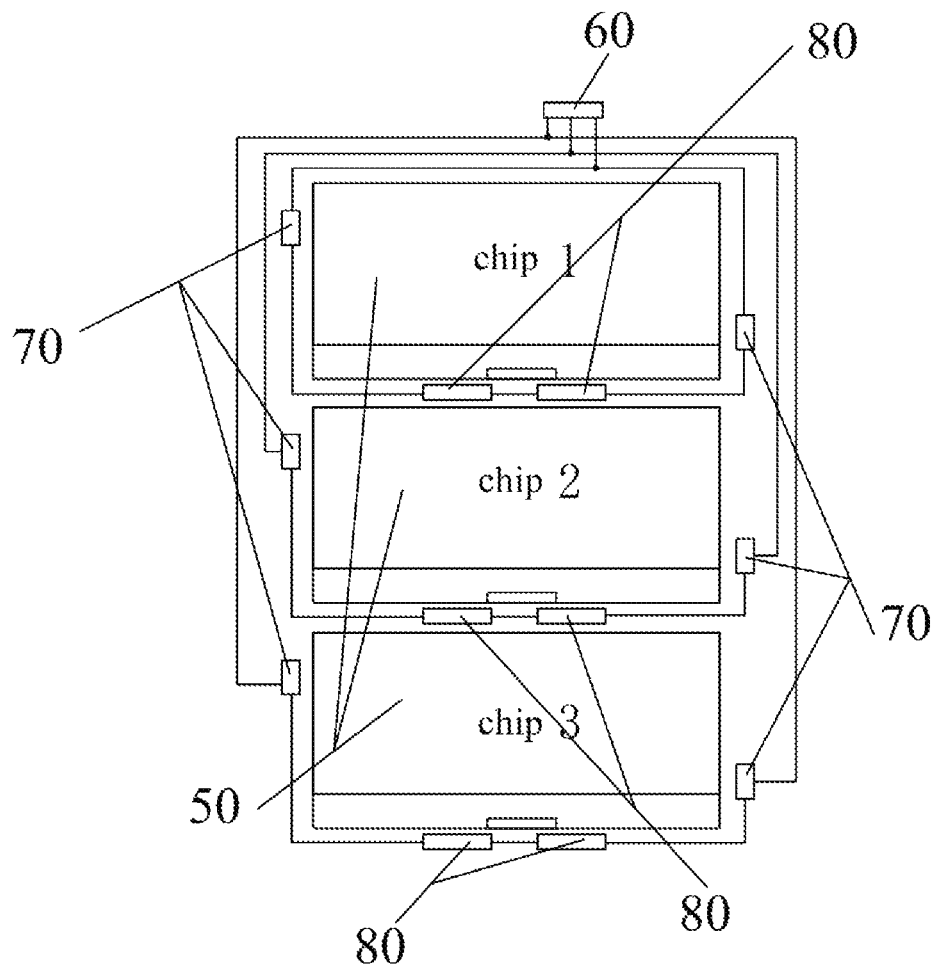
FIG. 6 is a design view illustrating the common structure of HAV pads in one preferred embodiment of the present invention.

Referring to FIG. 6, the design scheme of the common structure of HAV pads in one preferred embodiment of the present invention is illustrated. The common structure of HAV pads 60 of the present invention can be connected to the GOA circuits and the peripheral wires of the active areas in the active LCDs. One common structure of HAV pads 60 and others, such as array test pads 70 and cell test pads 80 are disposed around the peripheral wires of the chips 50. When the tests or the alignment process to liquid crystals are performed in the manufacturing process, testing device would be connected to the pads via the pins for providing the corresponding signals or voltages.

In conclusion, the common structure of HVA pads of the present invention uses one set of HAV pads to provide signals simultaneously for multiple chips, to perform tests or alignment processes to liquid crystals molecules, thereby to reduce process time and costs, for easing the tense space issue in design typography and promoting the utilization rate of the glass substrates.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A common structure of high vertical alignment (HVA) pads, comprising:
   a set of HVA pads for common use, wherein the set of HVA pads includes n clock pads, m DC high potential pads for inputting DC high potentials, a DC low potential pad for inputting a DC low potential, and n clock transferring circuits corresponding to the n clock pads separately;
   wherein m is a natural number larger than one illustrating a number of chips using in common the set of HVA pads, n is a natural number, and
   the n clock pads are connected separately to the corresponding n clock transferring circuits for inputting corresponding clock signals to the n clock transferring circuits individually, the m DC high potential pads and the DC low potential pad are connected to each the clock transferring circuit for inputting m DC high potentials and a DC low potential to each the clock transferring circuit; and
   when each the clock transferring circuit is input the corresponding clock signal, the m DC high potentials and the DC low potential, the corresponding clock signal is controlling each the clock transferring circuit to output m clock signals to the m chips according to the m DC high potentials and the DC low potential.

2. The common structure of HVA pads according to claim 1, wherein the m DC high potential pads are inputting a same DC high potential.

3. The common structure of HVA pads according to claim 2, wherein the m DC high potentials are square wave, and the DC high potential is a high level of the square wave.

4. The common structure of HVA pads according to claim 2, wherein the m DC high potentials are square wave, and the DC low potential is a low level of the square wave.

5. The common structure of HVA pads according to claim 1, wherein each the clock transferring circuit comprises m units, the m units are corresponding to the m DC high potential pads and the m chips separately, for outputting the corresponding clock signal to the corresponding chip, each the unit comprises:
   a first thin film transistor including a gate connected to the clock pad corresponding to the current clock transferring circuit, a source connected to the DC high potential pad corresponding to the current unit, and a drain connected to the chip corresponding to the current unit;
   a second thin film transistor including a gate being input a signal opposite in phase to a signal inputting to the gate of the first thin film transistor, a source connected to the chip corresponding to the current unit, and a drain connected to the DC low potential pad.

6. The common structure of HVA pads according to claim 1, wherein the corresponding clock signals input to the n clock transferring circuits through the clock pads are square wave, and the DC high potential is equal to a high level of the square wave.

7. The common structure of HVA pads according to claim 6, wherein the DC low potential is equal to a low level of the square wave.

8. The common structure of HVA pads according to claim 1, wherein the common structure of HVA pads is connected to GOA circuits and peripheral wires of an active area of an active LCD.

9. The common structure of HVA pads according to claim 1, wherein the set of HVA pads further comprises a color filter substrate common voltage pad for inputting a color filter substrate common voltage.

10. The common structure of HVA pads according to claim 1, wherein the set of HVA pads further comprises an array substrate common voltage pad for inputting an array substrate common voltage.

11. A common structure of high vertical alignment (HVA) pads, comprising:
   a set of HVA pads for common use, wherein the set of HVA pads includes n clock pads, m DC high potential pads for inputting DC high potentials, a DC low potential pad for inputting a DC low potential, and n clock transferring circuits corresponding to the n clock pads separately;
   wherein m is a natural number larger than one illustrating a number of chips using in common the set of HVA pads, n is a natural number, and
   the n clock pads are connected separately to the corresponding n clock transferring circuits for inputting corresponding clock signals to the n clock transferring circuits individually, the m DC high potential pads and the DC low potential pad are connected to each the clock transferring circuit for inputting m DC high potentials and a DC low potential to each the clock transferring circuit;
   when each the clock transferring circuit is input the corresponding clock signal, the m DC high potentials and the DC low potential, the corresponding clock signal is controlling each the clock transferring circuit to output m clock signals to the m chips according to the m DC high potentials and the DC low potential;
   wherein the m DC high potential pads are inputting a same DC high potential;
   wherein each the clock transferring circuit comprises m units; the m units are corresponding to the m DC high potential pads and the m chips separately, for outputting the corresponding clock signal to the corresponding chip; each the unit comprises:
   a first thin film transistor including a gate connected to the clock pad corresponding to the current clock transferring circuit, a source connected to the DC high potential pad corresponding to the current unit, and a drain connected to the chip corresponding to the current unit; and
   a second thin film transistor including a gate input a signal opposite in phase to a signal inputting to the gate of the first thin film transistor, a source connected to the chip corresponding to the current unit, and a drain connected to the DC low potential pad;
   wherein the common structure of HVA pads is connected to GOA circuits and peripheral wires of an active area of an active LCD;
   wherein the set of HVA pads further comprises a color filter substrate common voltage pad for inputting a color filter substrate common voltage; and
   wherein the set of HVA pads further comprises an array substrate common voltage pad for inputting an array substrate common voltage.

12. The common structure of HVA pads according to claim 11, wherein the m DC high potentials are square wave, and the DC high potential is a high level of the square wave.

13. The common structure of HVA pads according to claim 11, wherein the m DC high potentials are square wave, and the DC low potential is a low level of the square wave.

14. The common structure of HVA pads according to claim 11, wherein the corresponding clock signals input to the n clock transferring circuits through the clock pads are square wave, and the DC high potential is equal to a high level of the square wave.

15. The common structure of HVA pads according to claim 14, wherein the DC low potential is equal to a low level of the square wave.

* * * * *